United States Patent [19]

Ohtsuka et al.

[11] Patent Number: 4,872,008
[45] Date of Patent: Oct. 3, 1989

[54] KEY INPUT DEVICE

[75] Inventors: Akinori Ohtsuka; Hitoshi Kurita, both of Yamatokoriyama; Yasutei Fujii, Gojo, all of Japan

[73] Assignee: Matsushita Electric Industrial Co., Ltd., Kadoma, Japan

[21] Appl. No.: 110,327

[22] Filed: Oct. 20, 1987

[30] Foreign Application Priority Data

Oct. 20, 1986 [JP] Japan .................................. 61-248614
May 28, 1987 [JP] Japan .................................. 62-132474
May 28, 1987 [JP] Japan .................................. 62-132475

[51] Int. Cl.$^4$ ............................................. H03M 11/00
[52] U.S. Cl. ........................................ 341/26; 341/22; 200/5 R
[58] Field of Search ........... 340/365 S, 365 R, 365 A, 340/309.15; 341/22, 26, 34; 200/5 A, 5 R; 219/10.55 B, 10.55 R; 364/189

[56] References Cited

U.S. PATENT DOCUMENTS

| 4,429,301 | 1/1984 | Crumley et al. | 340/365 S |
| 4,544,924 | 10/1985 | French | 340/365 S |
| 4,581,603 | 4/1986 | Ingold et al. | 340/365 S |
| 4,583,189 | 4/1986 | Koyama | 340/365 S |
| 4,725,816 | 2/1988 | Petterson | 340/365 S |
| 4,736,190 | 4/1988 | Fiorella | 340/365 A |

Primary Examiner—Donald J. Yusko
Assistant Examiner—Tyrone Queen
Attorney, Agent, or Firm—Spencer & Frank

[57] ABSTRACT

In a key input device, the depression of any one of the keys of a keyboard applies a voltage to an analog-digital conversion input terminal and to one of a plurality of ordinary input terminals so that in accordance with the resulting analog-digital input terminal voltage and ordinary input terminal voltage, a microcomputer discriminates the depressed key.

7 Claims, 7 Drawing Sheets

KEY INPUT DEVICE

BACKGROUND OF THE INVENTION

The present invention relates generally to input means for apparatus of the type having a digital controller and more particularly to a key input device so designed that the identification of a depressed key is determined by the combined use of an analog-type signal and a digitaltype signal.

The receat development in the field of semiconductors have been so remarkable that the construction of control systems with electronic circuits has advanced rapidly. Thus, the construction of control systems and the shapes of control panels have undergone considerable changes and the construction of their input means have also undergone changeover from mechanical switches mainly to those types which discriminate the respective keys by means of a microcomputer through the medium of electric signals, thereby performing the desired control.

In addition, a wave of digitization has resulted in the addition of new functions one after another and the trend has been toward increasing the number of operating keys for effecting such functions.

However, the increase in the number of such keys has resulted in an increase in the input and output terminals of the microcomputer and hence the number of peripheral circuits has been increased from the construction standpoint of the system.

Figure 1A:
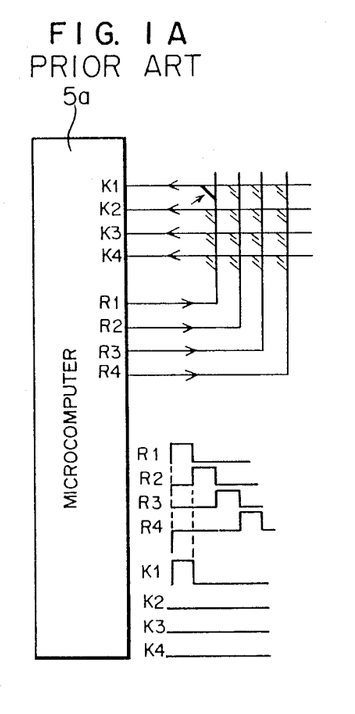
FIGS. 1A and 1B are diagrams showing conventional key input systems.

In view of these circumstances, as shown in FIG. 1A of the accompanying drawings attempts have been made to decrease the number of input and output terminals in proportion to the number of operating keys mainly by use of a key-scan matrix, in which a matrix circuit is formed by an output signal system and an input signal system so as to discriminate the kinds of a respective depressed keys with the reduced number of inputs and outputs.

This type of system includes a plurality of output ports R and a plurality of ordinary input terminals K so that scan pulses of a controlled timing are generated from the output ports and the corresponding pulse is applied to the input terminal connected to the depressed key, thereby discriminating the key.

However, this system is also not a method which drastically decreases the number of the required input and output terminals and therefore it is limited by the number of the input and output terminals of the microcomputer. Thus, if these input and output terminals are used only for operating key inputting purposes, there is a shortage of the input and output terminals for the other essential control purposes. Moreover, it leads to a pressure for the capacity of the ROM of the microcomputer used with this system for scan output control purposes, etc.

Figure 1B:
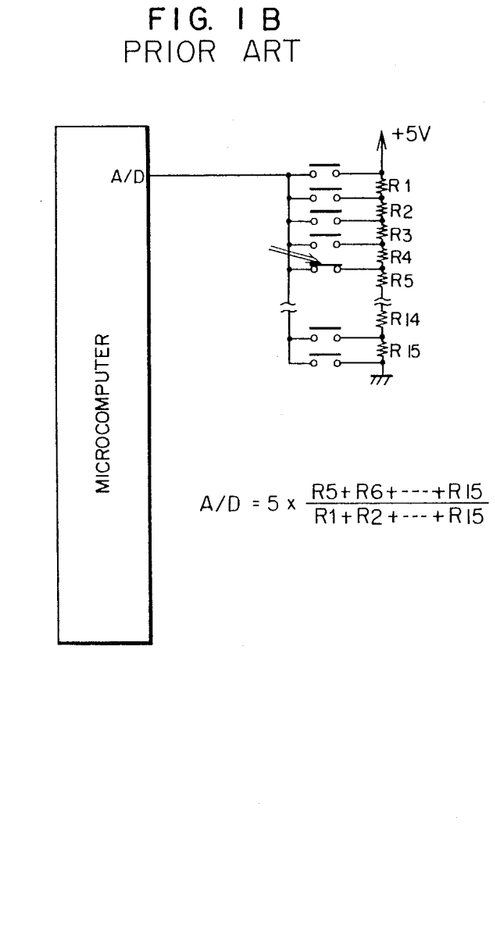

Also, as another example of the conventional methods, there has been a system which utilizes analog inputs. As shown in FIG. 1B, this system is of an analog-to-digital conversion (A/D conversion) type in which voltages generated by the depression of the respective keys differ from one another and each key is discriminated by converting the corresponding analog voltage to digital form.

Since this system includes an A/D conversion input terminal and each key is discriminated in accordance with a variation in the voltage generated by its depression, when the key at the fifth row from above in FIG. 1B is depressed, the following voltage is generated $$V_{A/D} = \frac{5V \times (R_5 + R_6 + \ldots + R_{15})}{(R_1 + R_2 + \ldots + R_{15})}$$

However, this system is also disadvantageous in that an increase in the number of keys requires a greater resolution for the A/D conversion and therefore it is necessary to use high-precision resistors for generating a voltage corresponding to each key, thus making the system unfavorable from the standpoint of cost and working performance.

SUMMARY OF THE INVENTION

In view of the background as mentioned above, it is an object of the present invention to provide an effective key input device so designed that operating key inputs are taken in by a novel means combining the A/D conversion system and the matrix system.

It is another object of the invention to provide an inexpensive key input device capable of easily meeting the requirement for an increase in the number of operating keys which is expected in the future.

DESCRIPTION OF THE PREFERRED EMBODIMENTS

Figure 2:
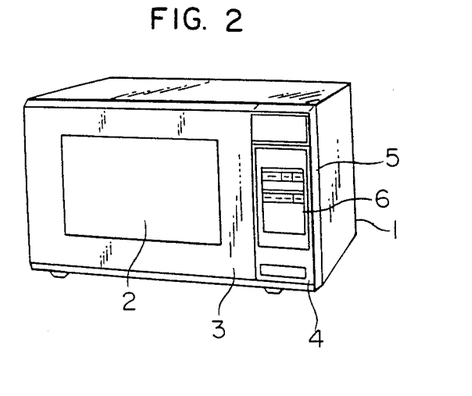
FIG. 2 is an external view of a high-frequency heating apparatus incorporating an embodiment of the invention.

Referring to FIG. 2, there is illustrated a perspective view of the body of a high-frequency heating apparatus incorporating an embodiment of the invention. Numeral 1 designates the body of a high-frequency heating apparatus. A heating chamber 2 is formed inside the body 1. Disposed within the heating chamber 2 is a stirrer or turn table (not shown) for ensuring more uniform wave distribution so as to improve the finish of food. Numeral 3 designates a hinged door fitted in the opening of the heating chamber 2, and 4 a control panel arranged on the front part of the body 1 to allow the user to set a cooking sequence such as cooking power and time. The control panel 4 contains a control circuit unit .5 including a microcomputer and a keyboard 6 for feeding the intention of the user into the microcomputer. In response to the input signals or information applied from the keyboard 6, the microcomputer 5a shown in FIG. 3 performs and controls the cooking sequence in accordance with the preprogrammed contents.

Figure 3:
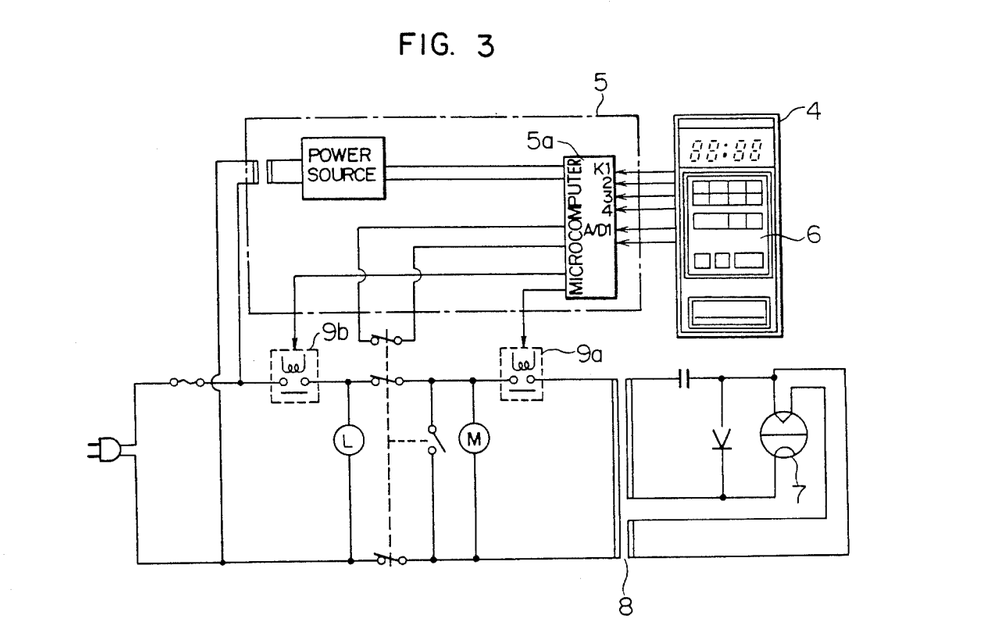
FIG. 3 is a circuit diagram of the apparatus of FIG. 2.

FIG. 3 shows a circuit diagram for the apparatus of FIG. 2. The apparatus includes a magnetron 7 serving as a high-frequency oscillator, a transformer 8 for supplying power to the magnetron 7, and switches 9a and 9b for switching on and off the power supplied to the transformer 8 to switch on and off the high-frequency output of the magnetron 7.

The microcomputer 5a includes ordinary input terminals $k_1$ to $K_4$ and an A/D conversion input terminal $A/D_1$ and the terminals are wired in correspondence to the respective keys of the keyboard 6. Also connected to the keyboard 6 is a +voltage (+5 V), illustrated in FIG. 6, which serves as a power supply for the microcomputer 5a and as an A/D conversion input power supply. The keyboard 6 includes a plurality of keys such as cooking power keys, cooking time keys and a start key and each of the keys has a separate switch function. These switch functions serve to open and close the circuits of the input terminals ($K_1 \sim K_4$, $A/D_1$) of the microcomputer 5a.

Figure 4:
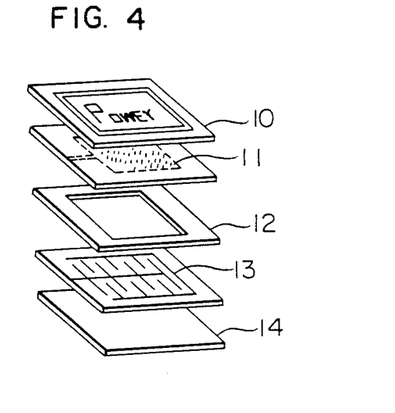
FIG. 4 is a diagram showing a detailed construction of one key input portion in the embodiment of FIG. 2.

Referring to FIG. 4, there is illustrated the construction of the switch function of one key portion in the keyboard 6. Numeral 10 designates a panel showing the functions of the keys and providing an external appearance. The panel 10 is designed so that it can be recognized easily by the user. Numeral 11 designates a conductive sheet forming contacts for the switch functions, numeral 12 designates a spacer providing contact gaps, arranged to ensure the insulation for those portions other than the contact portions of the keys and also formed with an opening at its portion corresponding to each contact portion to cause the conductive sheet 11 to directly face the openings, and 13 a pattern sheet having a plurality of contact patterns formed thereon to touch the conductive sheet 11 through the spacer 12 in response to the depression of the respective keys. In addition, a reinforcing sheet 14 is provided to reinforce the whole assembly.

Also, the conductive sheet 11 is connected to the metal portion of the high-frequency heating apparatus body with small screws or the like and the control circuit unit 5 is similarly connected electrically to the heating apparatus body, thereby connecting the 5-volt power supply of the microcomputer 5a to the conductive sheet 11 of the keyboard 6 through the metal portion of the heating apparatus body.

Figure 5:
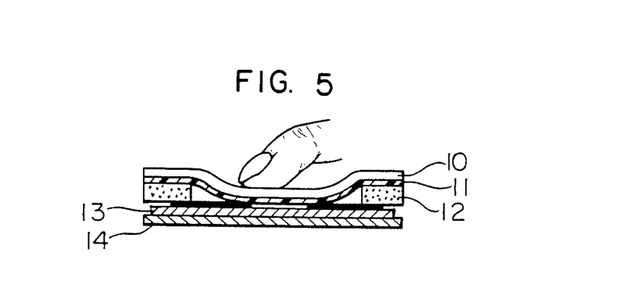
FIG. 5 is a sectional view for explaining the operation of one key input portion in the embodiment of FIG. 2.

With the construction described above, the operation of the embodiment will now be described. When food is placed in the heating chamber 2 and any one of the keys on the keyboard 6 of the control panel 4 is depressed to set the desired cooking time or power, as shown in FIG. 5, the conductive sheet 11 is bent and the power of +5 V is applied to the plurality of patterns formed on the pattern sheet 13 through the opening in the spacer sheet 12 and the conductive sheet 11.

Figure 6:
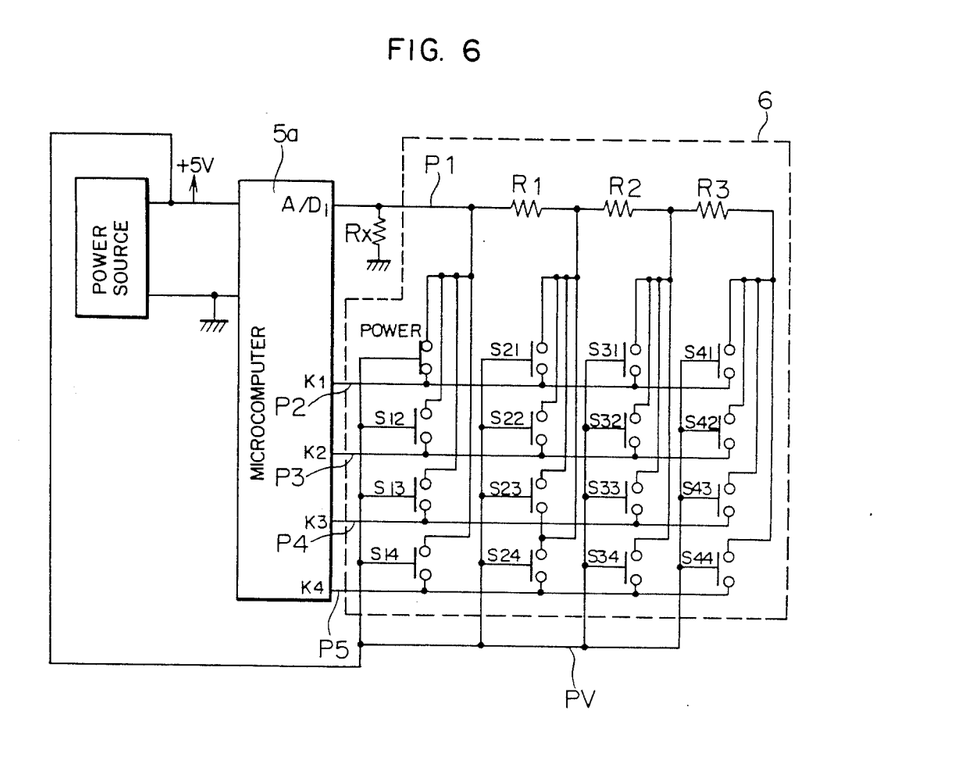
FIG. 6 is a diagram showing the construction of the key input section in the embodiment of FIG. 2.

Next, the operation of the signal system will be described with reference to FIG. 6 showing a connection diagram for the patterns on the pattern sheet 13 of the keyboard 6 and the microcomputer 5a. In the case of FIG. 6, the keys include 16 different ones so that if, for example, the POWER key is depressed, the voltage of 5 V is applied to the ordinary input terminal $K_1$ of the microcomputer 5a by the pattern $P_2$ of FIG. 6 and also the divided voltage by ladder resistors $R_1$, $R_2$, $R_3$ and $R_x$ is applied to the A/D conversion input terminal $A/D_1$ through the pattern $P_1$. In FIG. 6, the resolution of this ladder circuit is selectively set to four levels and therefore the voltage applied to the microcomputer 5a through the input terminal $A/D_1$ changes in response to the depression of the respective keys as follows.

(In case of POWER, $S_{12}$, $S_{13}$, $S_{14}$)

$$A/D_1 = 5 \ V \text{ (designated as a level 1)}$$

(In case of $S_{21}$, $S_{22}$, $S_{23}$, $S_{24}$)

$$A/D_1 = 5 \times \frac{R_x}{R_x + R_1} \text{ (designated as a level 2)}$$

(In case of $S_{31}$, $S_{32}$, $S_{33}$, $S_{34}$)

$$A/D_1 = 5 \times \frac{R_x}{R_x + R_1 + R_2} \text{ (designated as a level 3)}$$

(In case of $S_{41}$, $S_{42}$, $S_{43}$, $S_{44}$)

$$A/D_1 = 5 \times \frac{R_x}{R_x + R_1 + R_2 + R_3} \text{ (designated as a level 4)}$$

Figure 7:
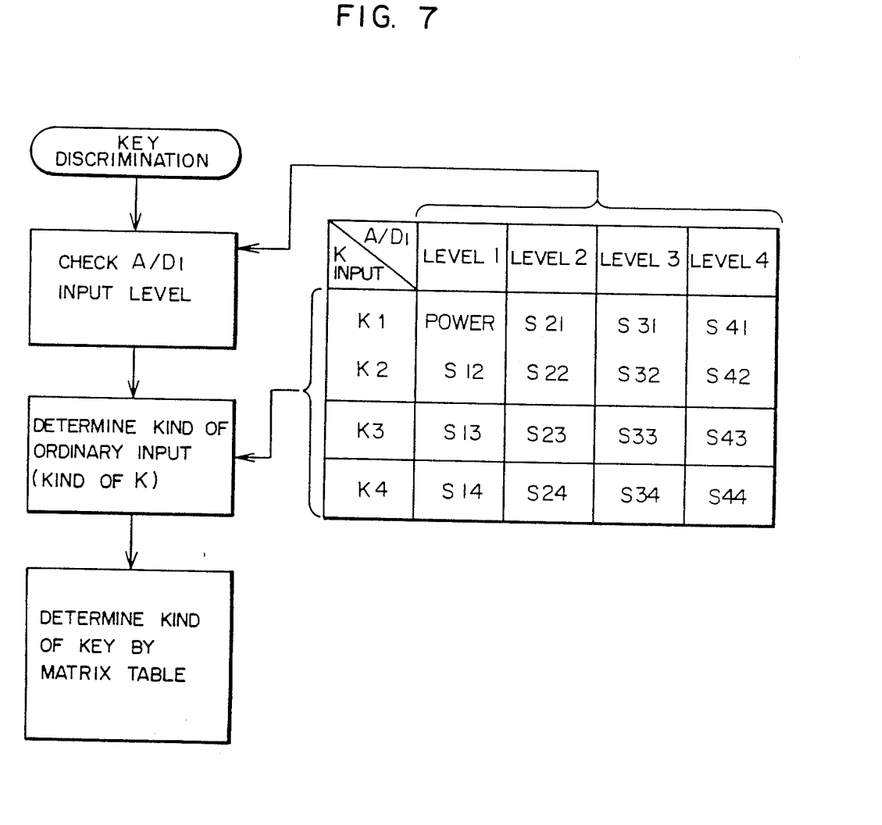
FIG. 7 is a diagram for explaining the control of the embodiment of FIG. 2.

On the other hand, the keys are also connected in groups of four keys each to the ordinary input terminals $K_1$, $K_2$, $K_3$ and $K_4$, respectively, and the matrix table of FIG. 7 is prepared in accordance with the various combinations of two input signals. In other words, the microcomputer 5a discriminates each key in accordance with the corresponding combination of two different input signals.

More specifically, in the previously mentioned cases the POWER key corresponds to the level 1 and the associated input is a $K_1$ input. On the other hand, the key $S_{33}$ corresponds to the level 3 and the associated input is a $K_3$ input. The microcomputer 5a determines first the kind of the ordinary input ($K_1 \sim K_4$) and it then determines the level of the A/D conversion input, thereby determining the kind of the depressed key. Also, the POWER, $S_{12}$, $S_{13}$ and $S_{14}$ keys, connected to the voltage of the level 1, are each placed in the preferential position in the corresponding row. For instance, when the POWER and $S_{21}$ keys are depressed simultaneously, the voltage of the level 1 is generated at the $A/D_1$ terminal and the smaller the level number is the higher the priority level is. Therefore, the preferential keys can be attained by simply determining the corresponding matrix positions and there is no need to increase the ROM capacity and the RAM capacity for any program.

Thus, in accordance with the present embodiment, the key scanning input terminals of the microcomputer 5a cna be reduced as compared with the conventional key matrix system and also any increase in the number of keys on the keyboard can be easily met with by increasing the A/D resolution levels for A/D conversion inputs. In addition, there is no need to use the output terminals for key scan outputs of the microcomputer 5a and therefore it is possible to expand the utilization of sensors, switches, etc., and the number of control functions. Also, due to the ample supply of output terminals of the microcomputer 5a the degree of freedom of designing is increased from the program designing standpoint of the microcomputer 5a with the resulting effect of having an unutilized portion in the ROM capacity of the microcomputer 5a and allowing additional utilization thereof.

Also, in accordance with the invention, application of voltage to the patterns is effected only when a key is depressed and therefore the invention is advantageous with respect to the problem of interpattern migration which can be encountered in the construction of the membranes. Moreover, as shown by the embodiment, only reduced resolution levels of resistor precision are required for A/D conversion resolution, and this is a great advantage from the accuracy standpoint of forming a resistor pattern on the actual membrane.

Figure 8:
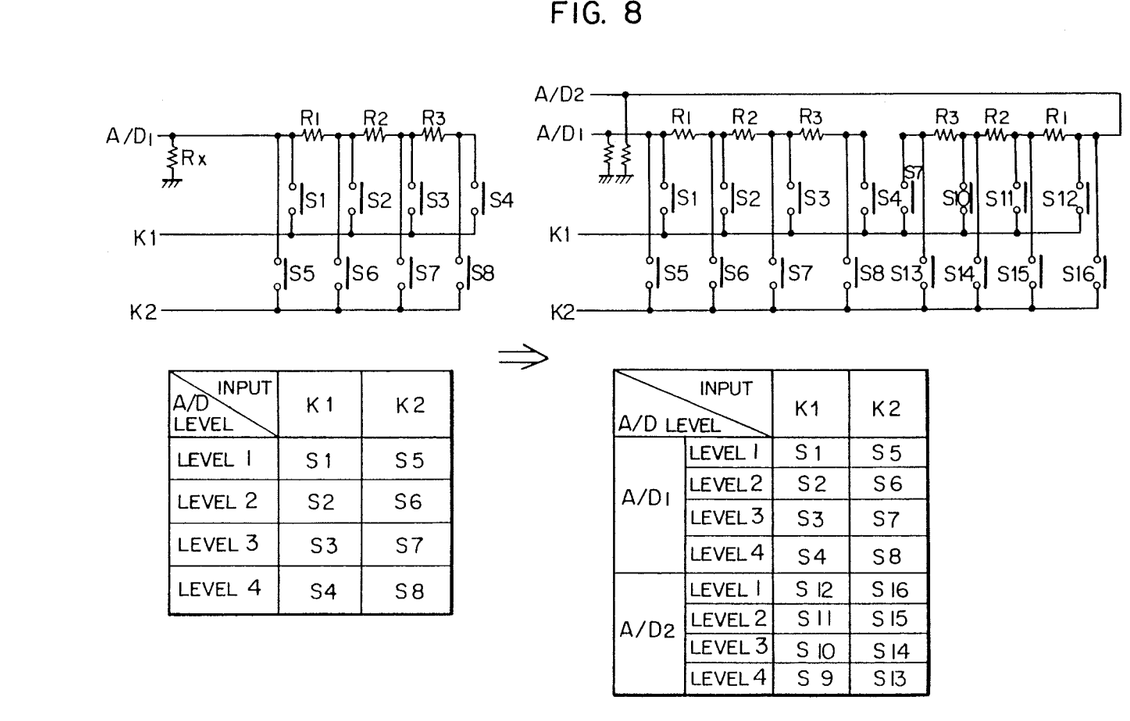
FIG. 8 is a diagram showing the construction of a key input section in a modification of the embodiment of FIG. 2.

Referring now to FIG. 8, a second embodiment of the invention will be described. This embodiment shows a case in which the number of keys is increased by two times by simply adding a single A/D conversion input terminal.

In other words, the number of keys can be doubled by combining the similar matrix with the additional A/D conversion input terminal and using the same ordinary input terminals $K_1$ and $K_2$ without any addition.

The corresponding key discrimination table is as shown in FIG. 8. Also, the same dividing resistors $R_1$, $R_2$, $R_3$ and $R_x$ for A/D conversion may be used for the terminals $A/D_1$ and $A/D_2$ or the dividing resistors for the two may be different from each other, and the provision of these dividing resistors can be realized easily.

Figure 9:
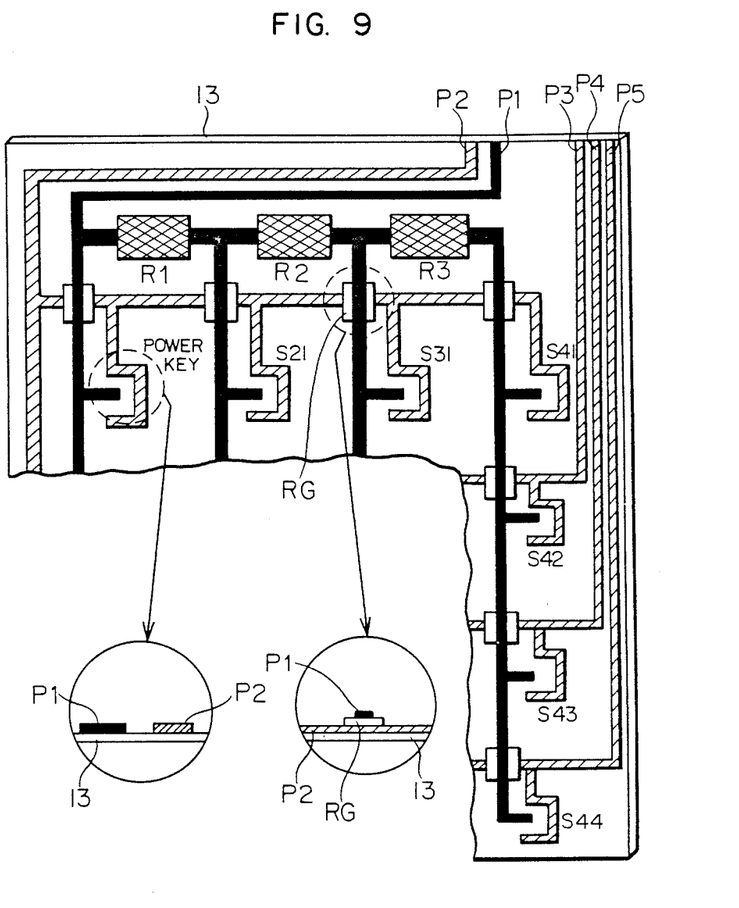
FIG. 9 is a pattern diagram of the key input section in the embodiment of FIG. 2.

Referring now to FIG. 9, the construction of the patterns formed on the pattern sheet 13 of the keyboard 6 will be described. With the key contact portions on the pattern sheet 13, the pattern $P_1$ and the patterns $P_2$, $P_3$, $P_4$ and $P_5$ are respectively arranged in comb form. The group of ladder resistors $R_1$, $R_2$ and $R_3$ prepared by, for example, forming carbon to the desired thickness, width, etc., to provide a high resistance value can be formed on a part of the pattern $P_1$ by the same operation as the other patterns. Since the present invention requires no increase in the resolution of the ladder resistors, the precision attained by this carbon resistor method can be considered sufficient for the ladder resistors. In addition, these resistors can be easily attained by the operation of printing and baking carbon on the pattern sheet 13. Also, as mentioned previously, the resistance value can be increased by decreasing the width of the carbon pattern and conversely the resistance value can be reduced by increasing the width of the carbon pattern. Also, with a view to reducing the resistance value, the patterns other than the resistors $R_1$, $R_2$ and $R_3$ may be formed with carbon mixed with such material as silver, thereby producing patterns having a very small resistance value. Also, a resist RG is placed at each of the points where the patterns overlap one another to prevent the patterns from contacting with one another. In other words, by using these techniques, the provision of the ladder resistor group of $R_1$, $R_2$ and $R_3$ of a high resistance value and the patterns $P_1$, $P_2$, $P_3$, $P_4$ and $P_5$ of a low resistance value and the provision of the resist portions RG at the pattern intersections can be easily effected.

Thus, there is an advantage from the cost point of view and also the number of the wires used for connecting the keyboard 6 and the microcomputer 5a is reduced to five (5) as compared with the eight (8) wires in the conventional key matrix system.

Moreover, the construction of this invention has the effect of greatly improving the quality in that except when a key is depressed so that the conductive sheet 11 supplied with 5 V is brought into contact with the pattern sheet 13 through the spacer sheet 12, no voltage is applied to the patterns on the pattern sheet 13 and the A/D conversion pattern $P_1$ and the ordinary input patterns $P_2$, $P_3$, $P_4$ and $P_5$ are all at the same potential, thereby preventing the occurrence of migration caused in the silver material which has been used frequently for such patterns.

Figure 10:
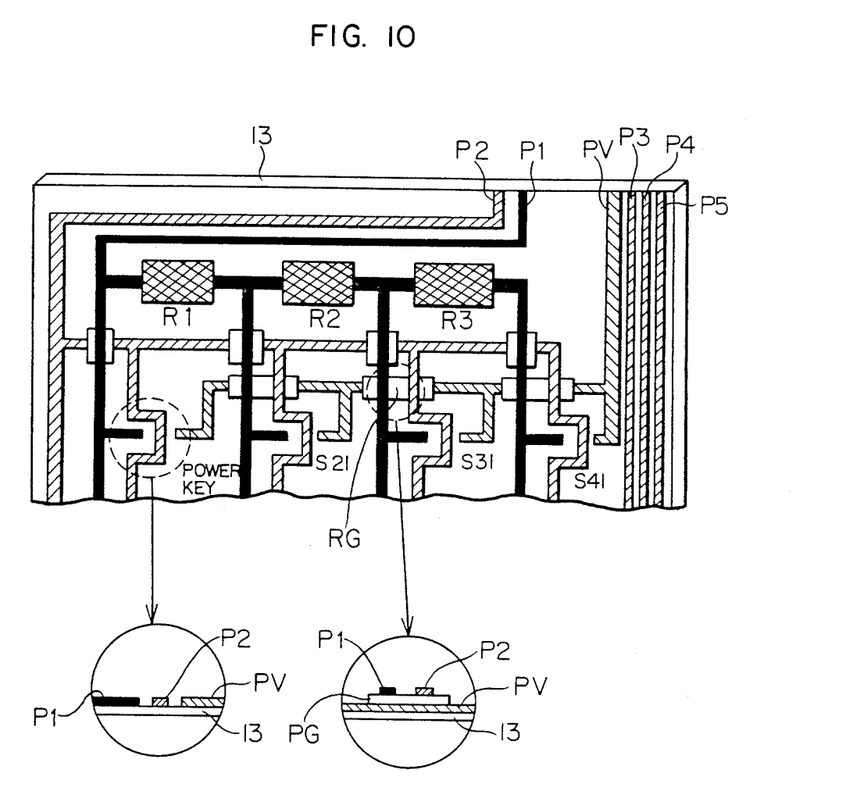
FIG. 10 is a pattern diagram of a key input section in another modification of the embodiment of FIG. 2.

Referring now to FIG. 10, there is illustrated a second embodiment of the pattern sheet 13 in which a pattern PV connected to the 5-volt power supply is formed as a third contact pattern on the pattern sheet 13, and the conductive sheet 11 simply forms a conductive film which is supplied with no voltage. With this construction, when any key is depressed, the patterns $P_1$ and $P_V$ and any one of the patterns $P_2$ to $P_5$ are connected through the conductive sheet 11 and the depressed key is discriminated by the previously mentioned operation.

From the foregoing description it will be seen that the key input apparatus with digital control means according to the invention has the following effects. (1) The number of microcomputer input terminals can be reduced as compared with the conventional key matrix system and also any increase in the number of keyboard keys can be easily dealt with by increasing the resolution levels for the A/D conversion input terminal. (2) Since the key matrix is formed by the ordinary input terminals and the A/D conversion input terminal, any increase in the number of the keys can be easily realized by simply increasing either of the two terminals which affords it. (3) Since the key matrix is formed by the ordinary input terminals and the A/D conversion input terminal, the A/D conversion accuracy need not be enhanced as compared with the conventional key input formed by the A/D conversion input terminal only and therefore the patterned resistors can be easily formed in the membrane, thereby easily realizing the key matrix without increasing the cost. (4) Since the microcomputer output terminals are utilized in no way in contrast to the conventional key matrix system, it is possible to utilize these output terminals to effect the expansion of control functions such as the utilization and increase of the external devices such as sensors and switches and hence it is possible to meet any requirements more sophisticatedly. (5) Due to the reduced number of lead-out patterns as compared with the conventional key matrix system, it is possible to reduce the number of pins of the connector for connecting the membrane and the P board. (6) Since the construction of this invention is such that the voltage is applied only when any key is depressed, and that when no key is depressed, there is no potential difference and no migration is caused among the patterns, the pattern designing of the membrane is simplified. (7) Since no key scanning output terminals for the microcomputer are used at all as compared with the conventional key matrix system, the program for key scanning purposes can be eliminated and the margin of the ROM capacity of the microcomputer can be increased. (8) The device can be constructed by simply arranging the high-priority keys and this can be realized without burdening the ROM with any program. (9) Since the conductive sheet is extended below the whole lower surface of the character sheet and it is then connected directly to the apparatus for grounding, the device is not easily affected by any external noise such as static electricity.

We claim:

1. A key input device comprising:
   control circuit means including a microcomputer having an analog-digital conversion input terminal and a plurality of ordinary input terminals and having programming functions; and a keyboard for applying input signals to said microcomputer, said keyboard including a plurality of separate-key-contact circuits, a first portion of said circuits connected through one of a plurality of predetermined resistances to said analog-digital conversion input terminal and a second portion connected to said ordinary input terminals, and a plurality of keys, each of said keys corresponding to a selected one of said keycontacts for applying a voltage to said analog-digital conversion input terminal through one of said resistances and to one of said ordinary input terminals so that, said microcomputer discriminates said depressed key through analysis of said input terminals and said analog-digital terminal.

2. A key input device comprising:

control circuit means including a microcomputer having an analog-digital conversion input terminal and a plurality of ordinary input terminals; and a membrane-type keyboard for feeding input signals to said microcomputer, said keyboard including a character sheet indicating positions of a plurality of keys, a conductive sheet having a conductive lower surface and arranged below said character sheet, a spacer sheet arranged below said conductive sheet and formed with a plurality of openings each opening corresponding to one of said keys, and a contact sheet arranged below said spacer sheet and formed with first, and second groups of contacts, with one contact of each of said groups provided for each of said keys, each contact of said first group being connected to a corresponding one of said ordinary input terminals of said microcomputer through a low-resistance pattern, each said contact of said second group being connected to said analog-digital conversion input terminal of said microcomputer through one of a plurality of predetermined resistance means, and said conductive sheet being connected to a power source of said microcomputer whereby when said character sheet is depressed at any one of said key positions, said conductive sheet simultaneously contacts one contact of each of said first and second contact groups through one of said openings formed in said spacer sheet, thereby connecting said power source through said conductive sheet to said contacts of said first and second groups.

3. A device according to claim 2, wherein said plurality of predetermined resistance means are resistance patterns printed in an open space among said contact groups on said contact sheet.

4. A device according to claim 2, wherein a voltage output of said power source is applied to said first and second contact groups only upon depression of said contact sheet, thereby maintaining said groups at an equal potential in the absence of depression.

5. A device according to claim 2, wherein said conductive sheet is connected to the power source of said microcomputer and to a ground of an apparatus employing said keyboard.

6. A key input device comprising:

control circuit means including a microcomputer having an analog-digital conversion input terminal and a plurality of ordinary input terminals; and a membrane-type keyboard for feeding input signals to said microcomputer, said keyboard including a character sheet having a print, indicating positions of a plurality of keys and providing an external appearance, a conductive sheet having a conductive lower surface and arranged below said character sheet, a spacer sheet formed with a plurality of openings each corresponding to one of said keys and arranged below said conductive sheet, and a contact sheet arranged below said spacer sheet and formed with first, second and third groups of contacts, with one contact of each of said groups provided for each of said keys, each contact of said first group being connected to one of said ordinary input terminals of said microcomputer through a low-resistance pattern, each contact of said second group being connected to said analogdigital conversion input terminal of said microcomputer through one of a plurality of predetermined resistance means printed on said contact sheet, and said contacts of said third contact group being connected to a power source of said micrcomputer whereby when said character sheet is depressed at any one of said key positions, said conductive sheet simultaneously contacts one contact of each of said first, second and third contact groups through one of said openings formed in said spacer sheet.

7. A key input device comprising:

control circuit means including a microcomputer having an analog-digital conversion input terminal and a plurality of ordinary input terminals and having programming functions; and a keyboard having a plurality of keys, circuit means connected to said keyboard for detecting actuation of at least one of said keys and for applying a first input signal of a predetermined voltage level corresponding to said actuated key to said analogdigital input of said microcomputer, and a second input signal to a selected one of said ordinary inputs corresponding to said actuated key, said microcomputer further comprising means for identifying said actuated key based on said voltage level and said corresponding ordinary input.

* * * * *